United States Patent
Chen et al.

(10) Patent No.: US 6,896,470 B1
(45) Date of Patent: May 24, 2005

(54) FRONT-OPENING UNIFIED POD AUTO-LOADING STRUCTURE

(75) Inventors: Kuan-Chou Chen, Hsinchu (TW); Ping-Yu Hu, Hsinchu Hsien (TW); Kuei-Jung Chen, Miao Li (TW); Tzong-Ming Wu, Taipei (TW); Wu-Lang Lin, Hsinchu Hsien (TW); Wen-Yo Lee, Taipei Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 801 days.

(21) Appl. No.: 09/705,733

(22) Filed: Nov. 6, 2000

(30) Foreign Application Priority Data

Sep. 8, 2000 (TW) ............................. 89215578 U

(51) Int. Cl.⁷ .......................................... B65G 65/34
(52) U.S. Cl. .................. 414/411; 414/217; 414/217.1; 414/940
(58) Field of Search .......................... 414/217, 217.1, 414/411, 940

(56) References Cited

U.S. PATENT DOCUMENTS

| | | | |
|---|---|---|---|
| 6,013,920 A | * | 1/2000 | Gordon et al. ......... 250/559.36 |
| 6,030,208 A | * | 2/2000 | Williams et al. ............ 432/253 |
| 6,060,721 A | * | 5/2000 | Huang ........................ 414/937 |
| 6,082,951 A | * | 7/2000 | Nering et al. ............ 414/217.1 |
| 6,281,516 B1 | * | 8/2001 | Bacchi et al. .......... 250/559.29 |
| 6,446,806 B1 | * | 9/2002 | Ohori et al. ................ 206/454 |

* cited by examiner

Primary Examiner—Eileen D. Lillis
Assistant Examiner—Michael Lowe
(74) Attorney, Agent, or Firm—Rabin & Berdo, P.C.

(57) ABSTRACT

The invention includes mainly a machine base, a carrier, a sliding control mechanism, a latch mechanism, a horizontal shifting mechanism, and a lifting mechanism. The FOUP (front-opening unified pod) is put on the carrier and latched by a locking plate of the latch at an accurate position. The carrier moves forwardly to tightly engage the FOUP to a gate on an access at a backboard of the machine base, and thus a cover of the FOUP is opened by a headstock gear at the back of the gate then carried backwardly away from the FOUP by the horizontal shifting mechanism and lowered by the lifting mechanism. Reversely, the cover is closed on the FOUP. As such, the cover is loaded and opened automatically, as well as in closed, which can be a part of automation and prevents wafers from contamination.

14 Claims, 7 Drawing Sheets

FRONT-OPENING UNIFIED POD AUTO-LOADING STRUCTURE

BACKGROUND OF THE INVENTION

1. Field of the Invention

The present invention relates to a FOUP (front-opening unified pod) auto-loading structure and, more particularly, to a FOUP auto-loading structure, which is suitable for use in the load port of a wafer manufacturing equipment to automatically close/open the cover of a FOUP.

2. Brief Description of the Prior Art

Current wafer process puts wafers in a unified pod such that the purity of the small inner of the unified pod is well controlled. Because the purity of the small inner of the unified pod is well controlled, the purity of the external cleanroom is less critical. This saves much clean expenditure on the wafer manufacturing equipment. However, external dust or human body dust may be carried in the manufacturing equipment when opening the cover of the unified pod manually, so as to bring about contamination to wafers.

SUMMARY OF THE INVENTION

The invention has been accomplished to provide a FOUP auto-loading structure, which eliminates the cited problem. It is an object of the present invention to provide a FOUP auto-loading structure, which automatically loads the FOUP for opening or closing its cover, thereby preventing wafers from contamination. It is another object of the present invention to provide a FOUP auto-loading structure, which can be a part of an full-automated wafer manufacturing process.

To achieve the objects and according to one aspect of the present invention, the FOUP auto-loading structure comprises a machine base, a carrier, a sliding control mechanism, a latch, a horizontal shifting mechanism and a lifting mechanism. The machine base has a backboard with an upper access, a table against middle of the backboard, and a base against bottom of the backboard. The carrier supported by the table is adapted to carry a FOUP. The carrier has an elongated opening close by the backboard. The sliding control mechanism is mounted on the table to support the carrier and control it toward or away from the access. The latch below the carrier has, a rail fixedly fastened on bottom thereof, a threaded rod disposed in parallel to the rail of the latch, a sliding pad threaded onto the threaded rod of the latch and adapted to slide along the rail of the latch, a motor adapted to rotate the threaded rod of the latch clockwise/counter-clockwise so as to make the sliding pad slide forwardly and backwardly, and a locking plate fixedly mounted on the sliding pad of the latch and adapted to latch the FOUP on the carrier by inserting through the elongated opening of the carrier and moving with the sliding pad of the latch to a retaining portion of the carrier. The horizontal shifting mechanism has a rail fixedly mounted on the base of the machine base, a horizontal threaded rod disposed in parallel to the rail of the horizontal shifting mechanism, a platform threaded onto the threaded rod of the horizontal shifting mechanism, and a motor to drive and control the platform to move horizontally along the rail of the horizontal shifting mechanism as rotating the threaded rod of the horizontal shifting mechanism clockwise/counter-clockwise, thereby moving the platform horizontally along the rail of the horizontal shifting mechanism toward/away from the backboard of the machine base. The lifting mechanism has a motor and a threaded rod and slider set vertically mounted on the platform of the horizontal shifting mechanism. The threaded rod and slider set has a vertical rail, a threaded rod longitudinally mounted in the vertical rail, a sliding pad threaded onto the threaded rod of the lifting mechanism and moved along the vertical rail upon the rotation of the threaded rod of the lifting mechanism. According to another aspect of the present invention, the FOUP auto-loading structure further comprises a headstock gear moved with the sliding pad of the lifting mechanism and controlled to close/open the cover of the FOUP on the carrier. According to still another aspect of the present invention, the headstock gear has a gate, two racks, two support arms and a driving unit. The gate moves in and out of the access of the backboard of the machine base. The two racks are fixedly fastened on a surface of the gate that does not contact the FOUP. The two support arms are respectively extended from the racks and connected to the sliding pad of the lifting mechanism. The driving unit mounted above the two racks and controlled to close/open the cover of the FOUP on the carrier has a transmission shaft, a motor controlled to rotate the transmission shaft, two rotary bolts respectively coupled to the transmission shaft and inserted through the through holes of said gate for engaging into the locking holes and rotating with the transmission shaft to thus close/open the cover of the FOUP on the carrier. According to still another aspect of the present invention, the carrier has a round opening for inserting through a locking bolt engaging with a locking bolt control motor to thus lock the FOUP on the carrier.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
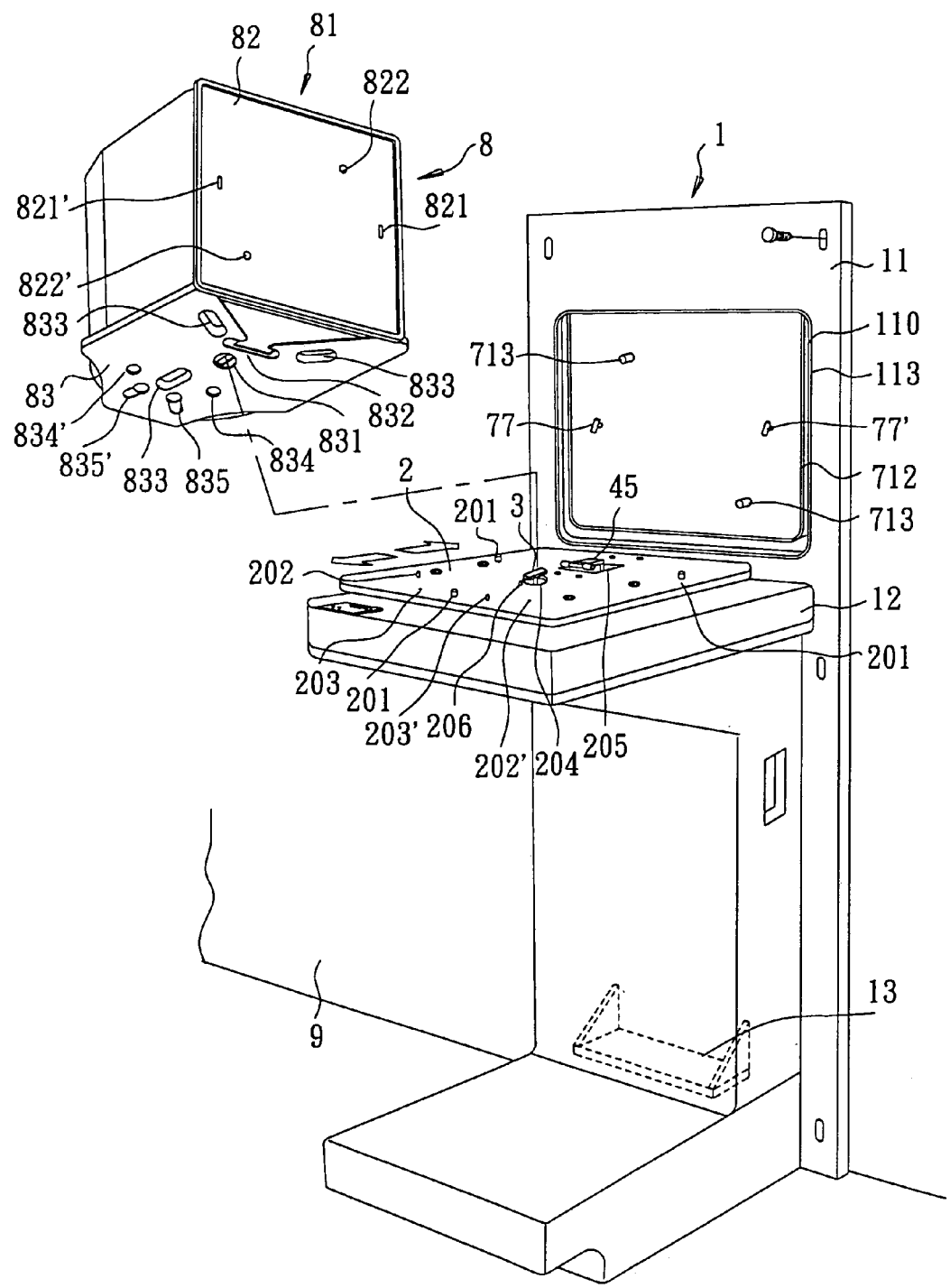
FIG. 1 is a perspective view of a FOUP auto-loading structure according to the present invention.

Referring to FIG. 1, a typical FOUP (front-opening unified pod) 8 and an inventive FOUP auto-loading structure are shown, wherein the inventive structure is applied for automatically loading a cover 82 of the FOUP 8 and opening/closing the cover. In addition to the cover 82, the FOUP 8 also includes an front-opening 81 closed by the cover 82 and a bottom plate 83. The cover 82 has two locking holes 821 and 821'. The bottom plate 83 has a positioning portion 831 at the center and a retaining portion 832 at a side close by the cover.

Referring to FIGS. 1 and 2, the inventive FOUP autoloading structure includes a machine base 1, a carrier 2, a sliding control mechanism 21, a latch 4, a horizontal shifting mechanism 5 and a lifting mechanism 6. The machine base, referenced by 1, has a backboard 11 fixedly disposed against load port of the manufacturing equipment 9 a table 12 is transversely disposed against middle of the backboard 11, a base 13 fixedly disposed against bottom of the backboard 11, an access 110 disposed at upper of the backboard 11, two parallel sliding slots 111 and 112 longitudinally disposed at the backboard 11 and below the table 12 (see also FIG. 4), and a gasket 113 fastened on edges of the access 110 facing the FOUP 8 and adapted to accommodate the front-opening 81 of the FOUP 8.

The carrier, referenced by 2, has three upright positioning rods 201 corresponding to three positioning grooves 833 at the bottom plate 83 of the FOUP 8 for positioning the FOUP 8 on the carrier 2, two first upright detecting pins 202 and 202' corresponding to two round recesses 834 and 834' at the bottom plate 83 of the FOUP 8 for detecting a frontend manufacturing process or backend manufacturing process, two second upright detecting pins 203 and 203' corresponding to detecting recesses 835 and 835' at the bottom plate 83 of the FOUP 8 for detecting if a type of the FOUP 8 is a 13-piece or 25-piece, and a third upright detecting pin 206 (see FIG. 2B) to determine if the FOUP 8 is positioned correctly. If the FOUP 8 does not match the upright detecting pins 201, 202 and 203', the bottom plate 83 is tilted and cannot press down the third upright detecting 206. In this case, it means that the FOUP 8 is not correctly positioned. The carrier 2 further has a round opening 204 to accommodate a locking bolt 3 (described later) and an elongated opening 205 to accommodate a locking plate 45 (described later).

Figure 2A:
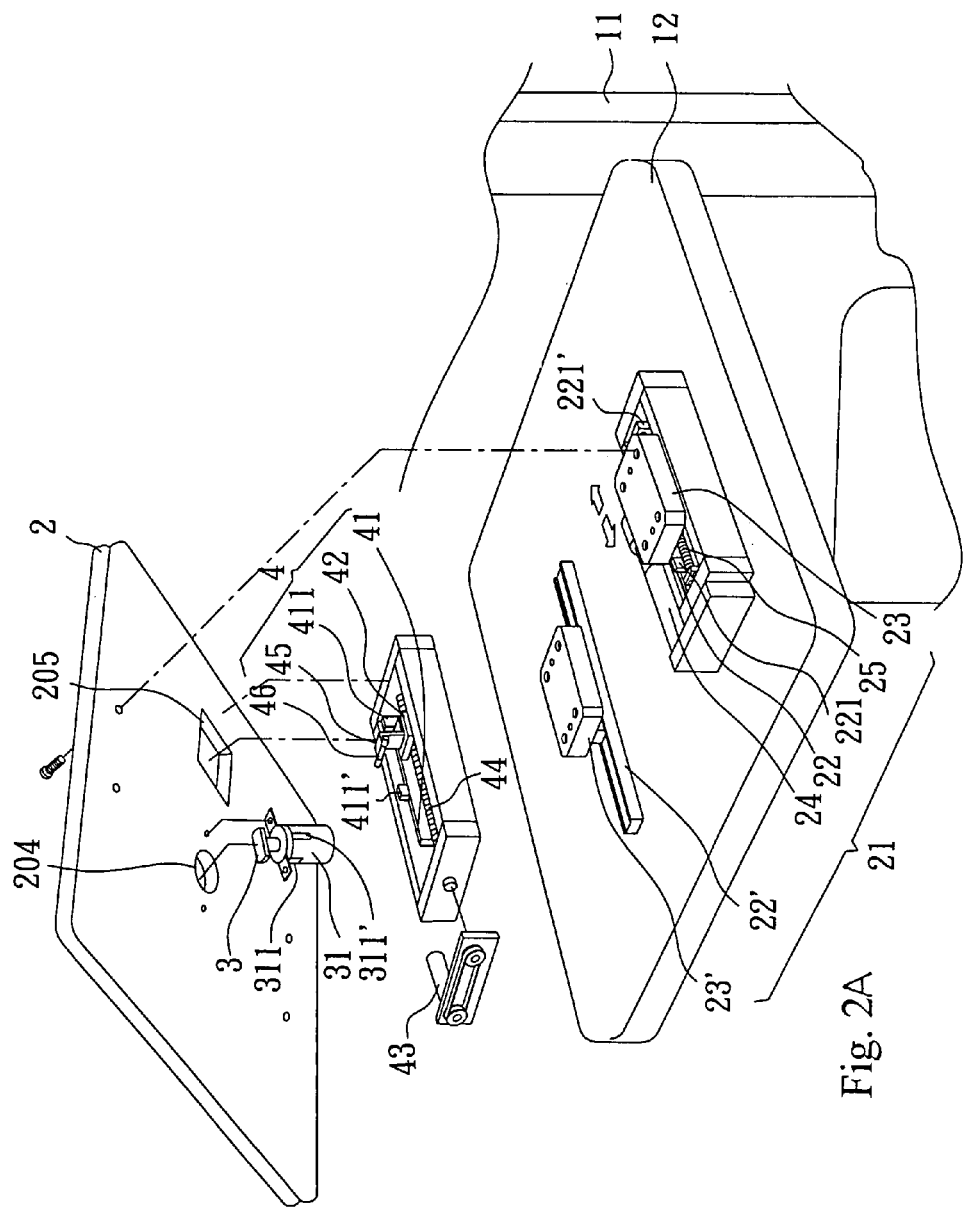
FIG. 2A is an exploded view of a part of the present invention, showing the arrangement of the latch, the locking bolt and locking bolt control motor, the sliding control mechanism, and the table.

FIG. 2A shows the carrier 2 supported by a sliding control mechanism 21 on the table 12. The sliding control mechanism 21 has two parallel rails 22 and 22' fixedly mounted on the table 12, limit switches 221 and 221' respectively disposed at two ends of rail 22, two sliding pads 23 and 23' fixedly mounted respectively on the parallel rails 22 and 22' of the carrier 2 for movement along the rails 22 and 22', a threaded rod 25 fixedly mounted on the table 12 below the sliding pad 23 close by the limit switches 221 and 221', and a reversible motor 24 adapted to rotate the threaded rod 25 clockwise/counter-clockwise. The sliding pad 23 is threaded onto the threaded rod 25. When starting the reversible motor 24 to rotate the threaded rod 25 clockwise or counter-clockwise, the carrier 2 is moved with the sliding pads 23 and 23' along the rails 22 and 22' toward or away from the access 110.

Figure 2B:
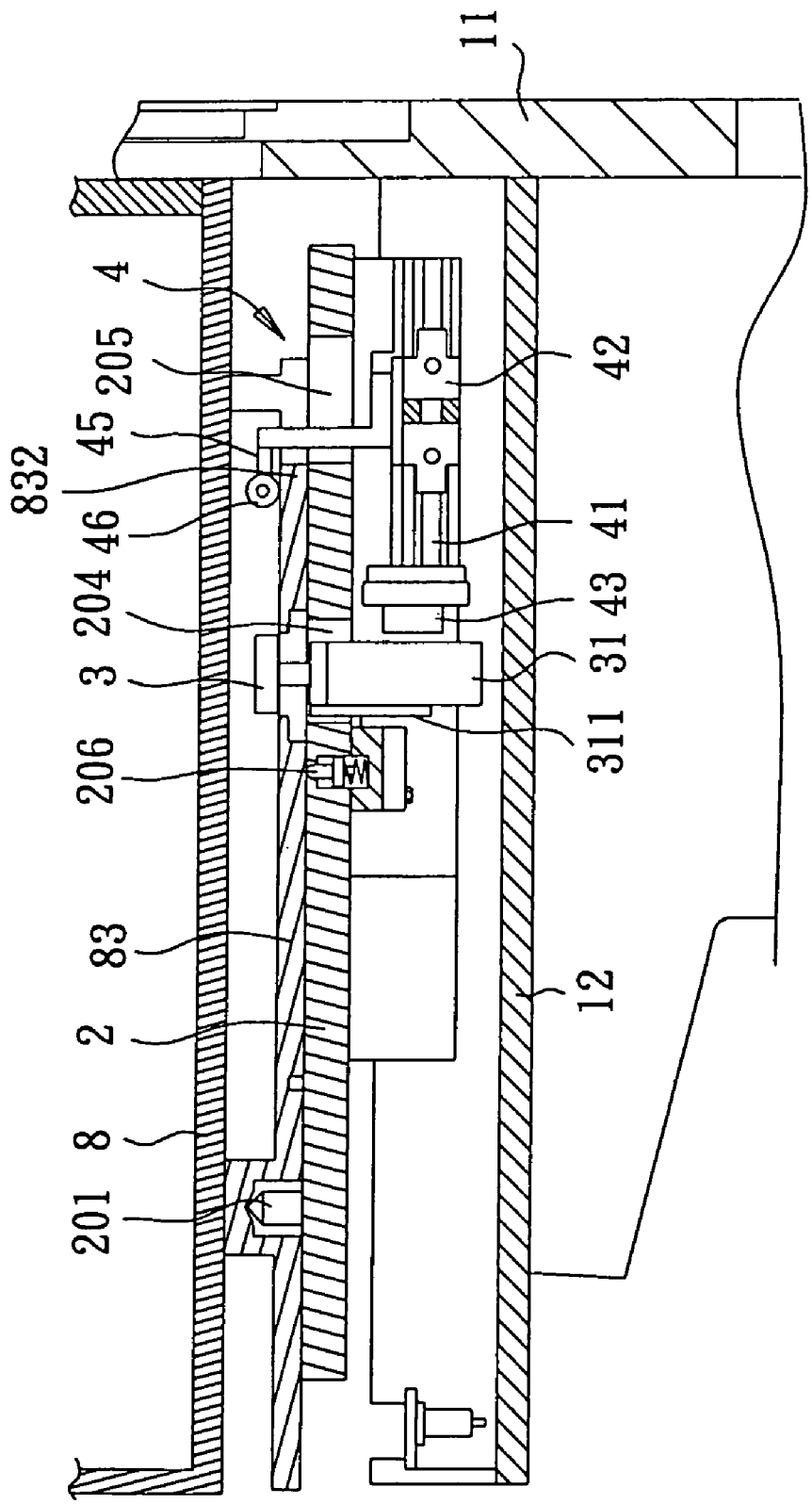
FIG. 2B is a sectional view of a part of the present invention, showing the arrangement of the latch, the locking bolt and locking bolt control motor, and the sliding control mechanism between the carrier and the table.

Referring to FIG. 2B and FIG. 2A again, a locking bolt control motor 31 and a latch 4 are fixedly fastened to the bottom of the carrier 2. A locking bolt 3 is a T shape with a stem coupling to the locking bolt control motor 31 through limit switches 311, 311' and a head inserting through the round opening 204 of the carrier 2 into the positioning portion 831 of the bottom plate 83 of the FOUP 8. After inserting the locking bolt 3 into the positioning portion 831 of the bottom plate 83 of the FOUP 8, the locking bolt control motor 31 rotates the locking bolt 3 by 90° angle to lock the FOUP 8. The limit switches 311 and 311' control the motor 31 to rotate clockwise or counterclockwise 90°, so as to move the locking bolt 3 between the lock and the unlock positions.

The latch 4 has a rail 41, a sliding pad 42, a motor 43, a threaded rod 44, the locking plate 45, limit switches 411, 411' and rollers 46. The rail 41 is fixedly fastened to a bottom of the latch 4 in parallel to the threaded rod 44 on which a slide 42 is disposed to move along the rail 41 with rotation of the threaded rod 44. The limit switches 411 and 411' are respectively mounted on two ends of the rail 41, and a motor 43 is controlled to rotate the threaded rod 44. The locking plate 45 is fixedly mounted on the sliding pad 42 and inserted through the elongated opening 205 of the carrier 2 to latch the retaining portion 832 of the bottom plate 83 of the FOUP 8. Clockwise/counter-clockwise rotation of the motor 43 drives the locking plate 45 to be moved forwardly and backwardly with the sliding pad 42, and therefore the locking plate 45 is pressed on or released from the retaining portion 832 of the bottom plate 83 of the FOUP 8. Further, the plastic rollers 46 are bilaterally disposed at top of the locking plate 45 in order to prevent the retaining portion 832 from being damaged as the retaining portion 832 presses down on the locking plate 45 and eliminates dust caused by friction between the retaining portion 832 and the locking plate 45.

Figure 3:
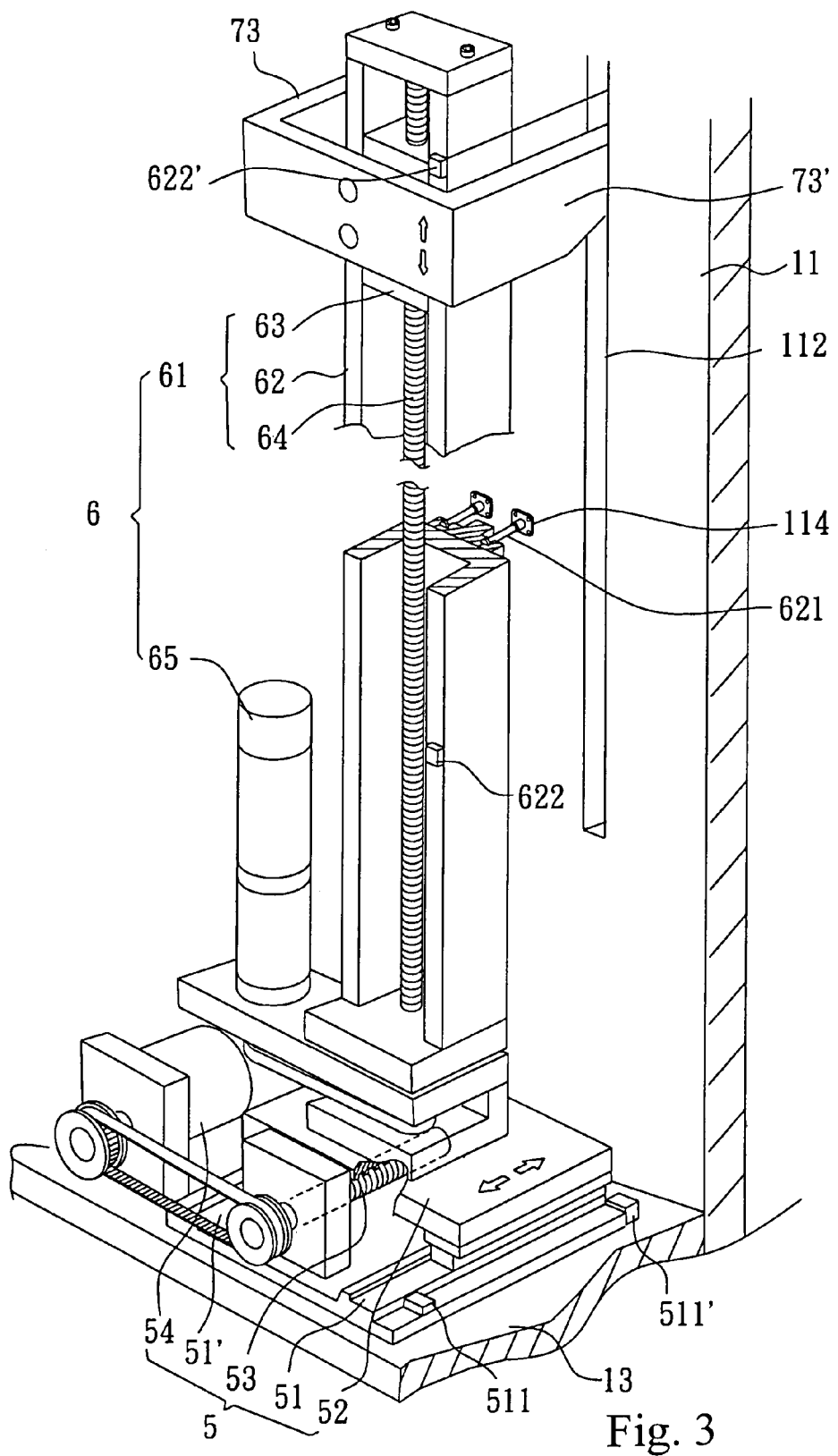
FIG. 3 is a perspective view of the lower part of the present invention, showing the arrangement of the horizontal shifting mechanism and the lifting mechanism.

Referring to FIG. 3, a horizontal shifting mechanism 5 and a lifting mechanism 6 are respectively installed over the base 13 of the machine base 1. The horizontal shifting mechanism 5 has two parallel rails 51 and 51' disposed respectively on the base 13 of the machine base 1 and extended perpendicular to the backboard 11, two limit switches 511 and 511' respectively disposed at two ends of rail 51, a horizontal threaded rod 53 disposed in parallel above the rails 51 and 51', a platform 52 threaded by the threaded rod 53 and movably supported by the rails 51 and 51', and a motor 54 to rotate the threaded rod 53 clockwise/counter-clockwise so as to move the platform 52 forwardly/backwardly along the rails 51 and 51' relative to the backboard 11. The lifting mechanism 6 has a threaded rod and slider set 61 and an upright motor 65 mounted on the platform 52 of the horizontal shifting mechanism 5. The threaded rod and slider set 61 has a vertical rail 62 of U-shaped cross section having an outward opening, two guide rods 621 connecting the vertical rail 62 to the backboard 11 by inserting through respective guide holes 114 of the backboard 11 for guiding the vertical rail 62 to horizontally move with the platform 52, a threaded rod 64 vertically mounted in the vertical rail 62, a sliding pad 63 threaded onto the threaded rod 64 and moved along the vertical rail 62 as rotating the threaded rod 64, and a limit switch 622 mounted in the vertical rail 62 to reduce an impact of the sliding pad 63. The motor 65 rotates the threaded rod 64 clockwise/counter-clockwise to thus move the sliding pad 63 upwardly/downwardly along the vertical rail 62.

Figure 4:
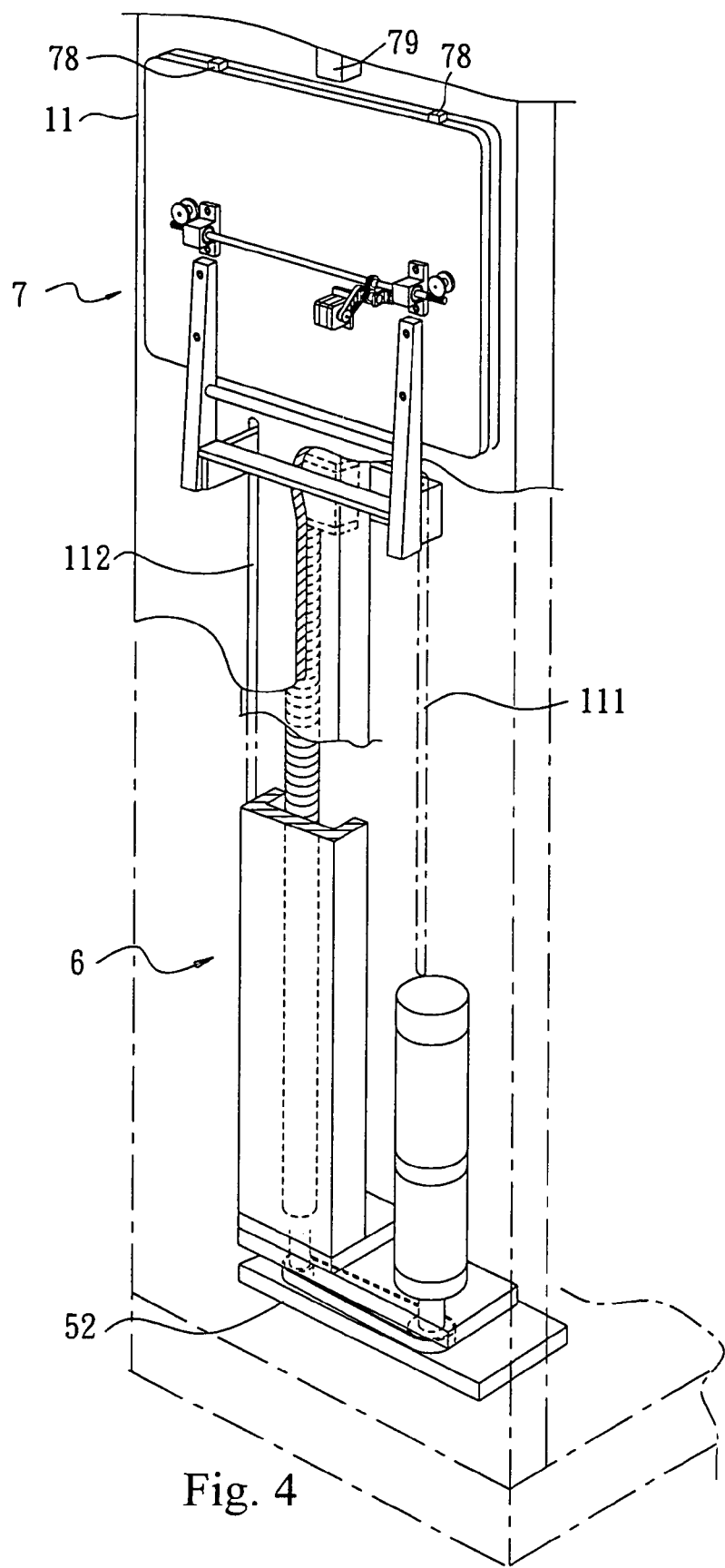
FIG. 4 is a perspective backside view of a part of the present invention, showing the arrangement of the lifting mechanism, the horizontal shifting mechanism, and the headstock gear.
Figure 5:
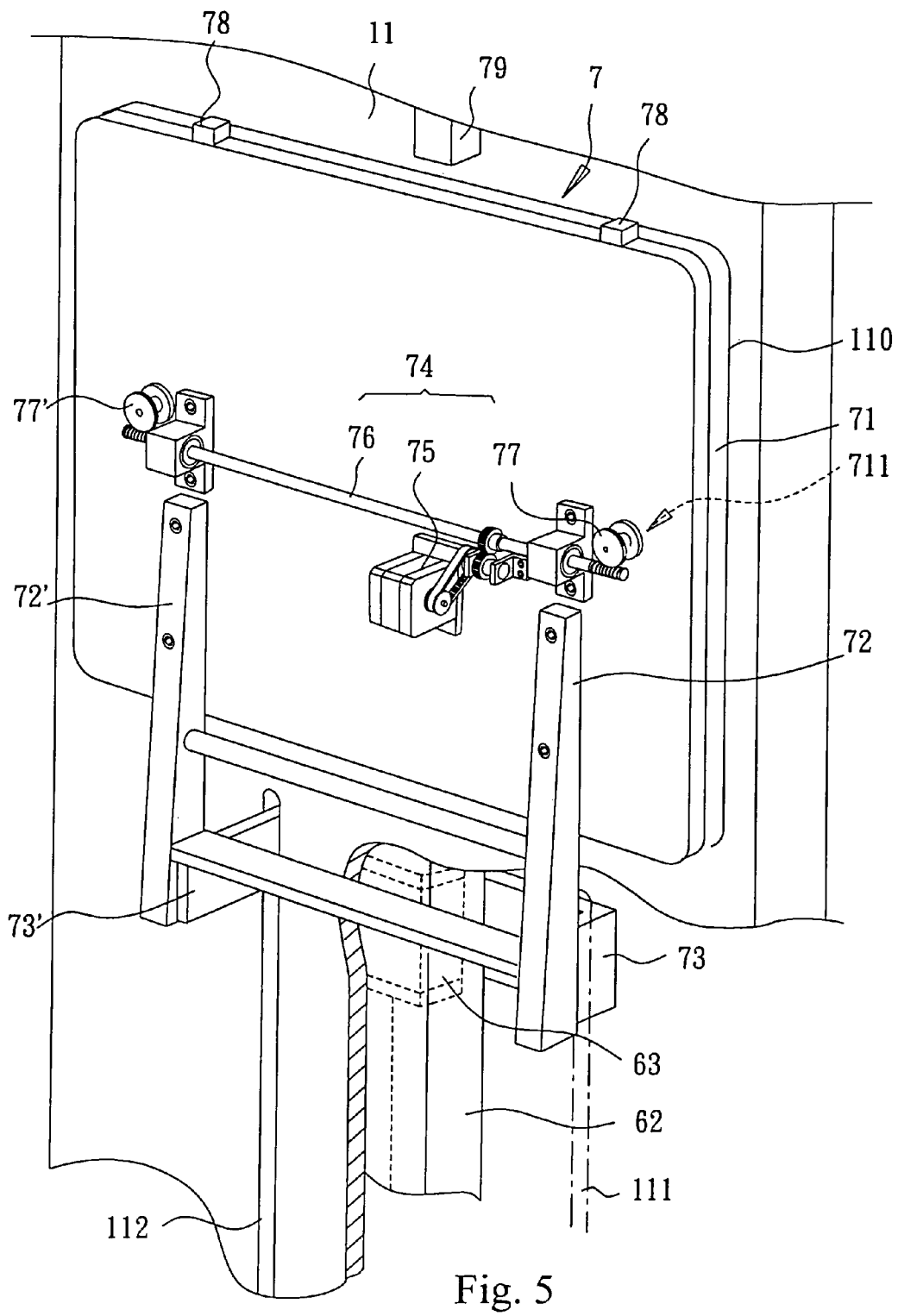
FIG. 5 is a perspective view in an enlarged scale of the upper part of FIG. 4.
Figure 6:
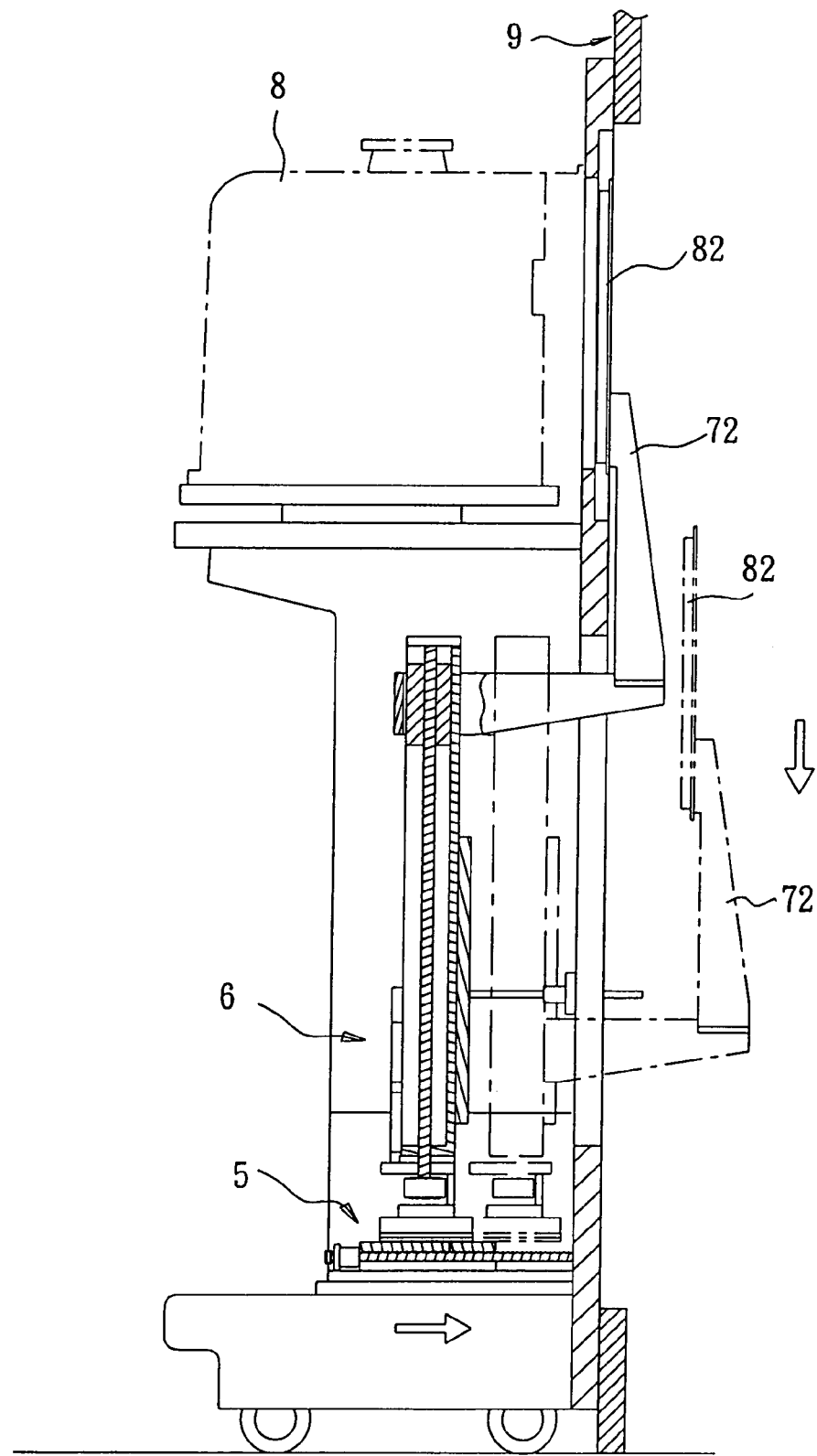
FIG. 6 is a schematic cross-section showing the operation of the present invention.

Referring to FIGS. 4 and 5 and FIG. 1 again, a headstock gear 7 is disposed on a backside of the backboard 11. The headstock gear 7 has a gate 71 fitting the access 110 of the backboard 11 and a gasket 712 fastened on edges of the gate 71 at a surface not contacting the FOUP 8 and adapted to accommodate the cover 82 of the FOUP 8. The gate 71 has two front positioning pins 713 respectively engaged to the positioning recesses 822 and 822' on the cover 82 of the FOUP 8 and to prevent the FOUP 8 from displacement and two through holes 711 corresponding to the locking holes 821 and 821' of the cover 82 of the FOUP 8. The headstock gear 7 also has two parallel racks 72 and 72' fixedly fastened on a back of the gate 71, two support arms 73 and 73' respectively disposed over the racks 72 and 72' below the gate 71 in order to insert through the sliding slots 111 and 112 of the backboard 11 and fixedly connect to the sliding pad 63 of the threaded rod and slider set 61 of the lifting mechanism 6 for enabling the gate 71 to be moved with the horizontal shifting mechanism 5 and the lifting mechanism 6, and a driving unit 74 mounted on the back of the gate 71 and controlled to close/open the cover 82 of the FOUP 8. The driving unit 74 has a transmission shaft 76, a motor 75 controlled to rotate the transmission shaft 76, two rotary bolts 77 and 77' respectively coupled to the transmission shaft 76 and inserted through the through holes 711 of the gate 71 for engaging into the locking holes 821 and 821' of the cover 82 of the FOUP 8 to open the cover 82 from the opening 81 of the FOUP 8. Further, at least one, for example, two detectors 78 are disposed on top of the gate 71. After opening the cover 82, the detectors 78 are moved with the gate 71 up and down relative to the FOUP 8 to detect wafer number and position in the FOUP 8. In addition, a detector 79 is mounted on the back of the backboard 11 above the access 110 to detect protrusive wafers in the FOUP 8, so as to prevent wafers from damage when closing/opening of the cover 82.

As stated above, when the FOUP 8 is carried to the carrier 2 by hand or an automatic truck, positioning of the FOUP 8 is detected by the detecting pins 202, 203 and 206, and then the detecting pin 206 is pressed down to start the motor 31 to rotate the locking bolt 3 by 90°, and therefore the locking bolt 31 is engaged with the positioning portion 831 on the bottom plate 83 of the FOUP 8. At the same time, the motor 43 of the latch 4 rotates the threaded rod 44 to move the locking plate 45 with the sliding pad 42 and engage with the retaining portion 831 of the bottom plate 83 of the FOUP 8. This double-locking effect can ensure accurately forward movement of the FOUP 8. The sliding control mechanism 21 then moves the carrier 2 and the FOUP 8 forwardly, causing the opening 81 of the FOUP 8 to be forced into close contact with the gasket 113 of the access 110. Therefore, when the motor 75 of the driving unit 74 rotates the rotary bolts 77 and 77' for opening the cover 82, the FOUP 8 is maintained free from contamination. Thereafter, the horizontal shifting mechanism 5 moves the cover 82 horizontally and backwardly, and then the lifting mechanism 6 lowers the cover 82 for allowing the internal mechanical arm of the manufacturing equipment 9 to carry wafers from the FOUP 8. On the contrary, when closing the cover 82 on the FOUP 8, the procedure is repeated reversely. Therefore, the FOUP 8 can be automatically opened and closed in the manufacturing equipment 9 without contamination.

Although the present invention has been explained in relation to its preferred embodiment, it is to be understood that many other possible modifications and variations can be made without departing from the spirit and scope of the invention as hereinafter claimed.

What is claimed is:

1. A front-opening unified pod auto-loading structure adapted to load a FOUP (front-opening unified pod), comprising:
    a machine base, having a backboard with an upper access, a table disposed at a middle of said backboard, and a base disposed at a bottom of said backboard;
    a carrier supported by said table and adapted to carry said FOUP, said carrier having an elongated opening close by the backboard and a detecting pin close by a center thereof for detecting if the FOUP is positioned accurately;
    a detector mounted on a back of said backboard above said access and adapted to detect protrusive wafers in the FOUP on said carrier;
    a sliding control mechanism mounted on said table to support said carrier and control movement of said carrier toward or away from said access;
    a latch below said carrier, having a rail fixedly fastened on a bottom of said carrier, a threaded rod disposed in parallel to the rail of said latch, a sliding pad threaded onto the threaded rod of said latch and adapted to slide along the rail of said latch, a motor adapted to rotate the threaded rod of said latch clockwise/counter-clockwise so as to make the sliding pad slide, and a locking plate fixedly mounted on the sliding pad of said latch and adapted to latch the FOUP on the carrier by inserting through the elongated opening of said carrier and moving with the sliding pad of said latch to a retaining portion of the carrier;
    a horizontal shifting mechanism, having a rail fixedly mounted on the base of said machine base, a horizontal threaded rod disposed in parallel to the rail of said horizontal shifting mechanism, a platform threaded onto the threaded rod of said horizontal shifting mechanism, and a motor to drive and control the platform to move horizontally along the rail of said horizontal shifting mechanism when rotating the threaded rod of said horizontal shifting mechanism clockwise/counter-clockwise, thereby moving said platform horizontally along the rail of said horizontal shifting mechanism toward/away from the backboard of said machine base;
    a lifting mechanism, having a motor and a threaded rod and slider set vertically mounted on the platform of said horizontal shifting mechanism, said threaded rod and slider set having a vertical rail, a threaded rod longitudinally mounted in said vertical rail, and a sliding pad threaded onto the threaded rod of said lifting mechanism and moved along said vertical rail upon rotation of the threaded rod of said lifting mechanism; and
    a headstock gear moved with the sliding pad of said lifting mechanism and controlled to close/open a cover of the FOUP on said carrier, said headstock gear comprising:
        a gate to move in and out of the access of said backboard of said machine base, said gate having two through-hole portions;
        two racks respectively fixedly fastened on a surface of said gate that does not contact the FOUP;
        two support arms respectively extended from said racks and connected to the sliding pad of said lifting mechanism; and
        a driving unit mounted above the two racks and controlled to close/open the cover of the FOUP on said carrier, said driving unit having a transmission shaft, a motor controlled to rotate said transmission shaft, two rotary bolts respectively coupled to said transmission shaft and inserted through the through-hole portions of said gate for engaging into locking-hole portions formed in the cover of the FOUP and rotating with said transmission shaft to thus close/open the cover of the FOUP on said carrier.

2. The front-opening unified pod auto-loading structure as claimed in claim 1, wherein said sliding control mechanism has a rail, a threaded rod disposed in parallel to the rail of said sliding control mechanism, a sliding pad threaded onto the threaded rod of said sliding control mechanism and fastened to a bottom sidewall of said carrier and adapted to move said carrier along the rail of said sliding control mechanism upon rotation of the threaded rod of said sliding control mechanism, and a motor controlled to rotate the threaded rod of said sliding control mechanism.

3. The front-opening unified pod auto-loading structure as claimed in claim 1, wherein said carrier has a round opening; further comprising a locking bolt inserted in the round opening and being driven by a motor to thus lock the FOUP on said carrier.

4. The front-opening unified pod auto-loading structure as claimed in claim 1, wherein said carrier has a plurality of positioning rods for engaging into respective positioning grooves on the FOUP to hold the FOUP in position.

5. The front-opening unified pod auto-loading structure as claimed in claim 1, wherein said carrier has a plurality of detecting pins for detecting a manufacturing process stage.

6. The front-opening unified pod auto-loading structure as claimed in claim 1, wherein said backboard has a gasket mounted on edges of said access facing the FOUP.

7. The front-opening unified pod auto-loading structure as claimed in claim 1, wherein said gate has a gasket mounted on edges of a surface thereof that does not contact the FOUP.

8. The front-opening unified pod auto-loading structure as claimed in claim 1, wherein said gate has a plurality of positioning pins to engage respective positioning recesses on the cover of the FOUP on said carrier.

9. The front-opening unified pod auto-loading structure as claimed in claim 1, wherein said locking plate of said latch has at least one roller disposed at top thereof.

10. The front-opening unified pod auto-loading structure as claimed in claim 1, wherein said backboard of said machine base has two guide-hole portions, and said vertical rail of said lifting mechanism has two guide rods backwardly extended to be respectively inserted through the guide-hole portions of said backboard of said machine base for guiding a horizontal movement of said lifting mechanism with said horizontal shifting mechanism.

11. The front-opening unified pod auto-loading structure as claimed in claim 1, further comprising limit switches to respectively control clockwise and counter-clockwise rotation of the motors of said latch, said horizontal shifting mechanism and said lifting mechanism.

12. The front-opening unified pod auto-loading structure as claimed in claim 1, wherein the head stock gear has detectors mounted on top of said gate and adapted to detect a wafer number and position in the FOUP on said carrier.

13. A front-opening unified pod auto-loading structure adapted to load a FOUP (front-opening unified pod), comprising:
   a machine base, having a backboard with an upper access, a table disposed at a middle of said backboard, and a base disposed at a bottom of said backboard;
   a carrier supported by said table and adapted to carry said FOUP, said carrier having an elongated opening close by the backboard and a detecting pin close by a center thereof for detecting if the FOUP is positioned accurately;
   a detector mounted on a back of said backboard above said access and adapted to detect protrusive wafers in the FOUP on said carrier;
   a sliding control mechanism mounted on said table to support said carrier and control movement of said carrier toward or away from said access;
   a latch below said carrier, having a rail fixedly fastened on a bottom of said carrier, a threaded rod disposed in parallel to the rail of said latch, a sliding pad threaded onto the threaded rod of said latch and adapted to slide along the rail of said latch, a motor adapted to rotate the threaded rod of said latch clockwise/counter-clockwise so as to make the sliding pad slide, and a locking plate fixedly mounted on the sliding pad of said latch and adapted to latch the FOUP on the carrier by inserting through the elongated opening of said carrier and moving with the sliding pad of said latch to a retaining portion of the carrier;
   a horizontal shifting mechanism, having a rail fixedly mounted on the base of said machine base, a horizontal threaded rod disposed in parallel to the rail of said horizontal shifting mechanism, a platform threaded onto the threaded rod of said horizontal shifting mechanism, and a motor to drive and control the platform to move horizontally along the rail of said horizontal shifting mechanism when rotating the threaded rod of said horizontal shifting mechanism clockwise/counter-clockwise, thereby moving said platform horizontally along the rail of said horizontal shifting mechanism toward/away from the backboard of said machine base; and
   a lifting mechanism, having a motor and a threaded rod and slider set vertically mounted on the platform of said horizontal shifting mechanism, said threaded rod and slider set having a vertical rail, a threaded rod longitudinally mounted in said vertical rail, and a sliding pad threaded onto the threaded rod of said lifting mechanism and moved alone said vertical rail upon rotation of the threaded rod of said lifting mechanism;
   wherein said carrier has a plurality of detecting pins for detecting a type of the FOUP thereon.

14. A front-opening unified pod auto-loading structure adapted to load a FOUP (front-opening unified pod), comprising:
   a machine base, having a backboard with an upper access, a table disposed at a middle of said backboard, and a base disposed at a bottom of said backboard;
   a carrier supported by said table and adapted to carry said FOUP, said carrier having an elongated opening close by the backboard and a detecting pin close by a center thereof for detecting if the FOUP is positioned accurately;
   a detector mounted on a back of said backboard above said access and adapted to detect protrusive wafers in the FOUP on said carrier;
   a sliding control mechanism mounted on said table to support said carrier and control movement of said carrier toward or away from said access;
   a latch below said carrier, having a rail fixedly fastened on a bottom of said carrier, a threaded rod disposed in parallel to the rail of said latch, a sliding pad threaded onto the threaded rod of said latch and adapted to slide along the rail of said latch, a motor adapted to rotate the threaded rod of said latch clockwise/counter-clockwise so as to make the sliding pad slide, and a locking plate fixedly mounted on the sliding pad of said latch and adapted to latch the FOUP on the carrier by inserting through the elongated opening of said carrier and moving with the sliding pad of said latch to a retaining portion of the carrier;
   a horizontal shifting mechanism, having a rail fixedly mounted on the base of said machine base, a horizontal threaded rod disposed in parallel to the rail of said horizontal shifting mechanism, a platform threaded onto the threaded rod of said horizontal shifting mechanism, and a motor to drive and control the platform to move horizontally along the rail of said horizontal shifting mechanism when rotating the threaded rod of said horizontal shifting mechanism clockwise/counterclockwise, thereby moving said platform horizontally along the rail of said horizontal shifting mechanism toward/away from the backboard of said machine base; and a lifting mechanism, having a motor and a threaded rod and slider set vertically mounted on the platform of said horizontal shifting mechanism, said threaded rod and slider set having a vertical rail, a threaded rod longitudinally mounted in said vertical rail, and a sliding pad threaded onto the threaded rod of said lifting mechanism and moved along said vertical rail upon rotation of the threaded rod of said lifting mechanism;

wherein said backboard of said machine base has two parallel sliding slots longitudinally extended below said table.

\* \* \* \* \*